United States Patent
Tran et al.

(10) Patent No.: US 6,480,054 B2
(45) Date of Patent: Nov. 12, 2002

(54) DIGITAL ELECTRONIC CIRCUIT FOR USE IN IMPLEMENTING DIGITAL LOGIC FUNCTIONS

(76) Inventors: Dzung Joseph Tran, 14244 SW. Koven Ct., Tigard, OR (US) 97224; Mark W. Acuff, 4780 NW. Sewell Rd., Hillsboro, OR (US) 97124

(*) Notice: Subject to any disclaimer, the term of this patent is extended or adjusted under 35 U.S.C. 154(b) by 0 days.

(21) Appl. No.: 09/939,348

(22) Filed: Aug. 24, 2001

(65) Prior Publication Data

US 2002/0053938 A1 May 9, 2002

Related U.S. Application Data

(63) Continuation of application No. 09/477,153, filed on Jan. 4, 2000, now Pat. No. 6,288,593.

(51) Int. Cl.$^7$ ............................................. H03K 17/62
(52) U.S. Cl. ..................... 327/408; 327/404; 326/50
(58) Field of Search ..................... 327/404, 407–410, 327/412, 413; 326/37, 38, 49, 50, 104, 112, 113, 119, 121, 122

(56) References Cited

U.S. PATENT DOCUMENTS

| | | | |
|---|---|---|---|
| 3,100,294 A | 8/1963 | Dryden | 340/825 |
| 4,541,067 A | 9/1985 | Whitaker | 364/716 |
| 4,593,390 A | 6/1986 | Hildebrand et al. | 370/112 |
| 4,620,117 A | 10/1986 | Fang | 326/113 |
| 4,910,417 A | 3/1990 | El Gamal et al. | 326/41 |
| 4,926,423 A | 5/1990 | Zukowski | 370/112 |
| 5,015,881 A | 5/1991 | Chappell et al. | 326/108 |
| 5,040,139 A | 8/1991 | Tran | 364/760 |
| 5,162,666 A | 11/1992 | Tran | 327/408 |
| 5,200,907 A | 4/1993 | Tran | 364/490 |
| 5,430,393 A * | 7/1995 | Shankar et al. | 327/142 |
| 5,440,245 A | 8/1995 | Galbraith et al. | 326/38 |
| 5,491,431 A | 2/1996 | Nasserbakht | 326/38 |
| 5,548,552 A | 8/1996 | Madurawe | 365/185.33 |
| 5,587,666 A | 12/1996 | Burchfield | 326/17 |
| 5,646,558 A | 7/1997 | Jamshidi | 326/106 |
| 5,773,995 A * | 6/1998 | Crocker | 326/108 |
| 5,781,033 A * | 7/1998 | Galbraith et al. | 326/39 |
| 5,831,453 A | 11/1998 | Stamoulis et al. | 326/113 |
| 5,955,912 A | 9/1999 | Ko | 327/410 |
| 5,963,052 A | 10/1999 | Shingaki et al. | 326/46 |
| 6,124,736 A * | 9/2000 | Yamashita et al. | 326/113 |
| 6,288,593 B1 * | 9/2001 | Tran et al. | 327/408 |

\* cited by examiner

*Primary Examiner*—Timothy P. Callahan
*Assistant Examiner*—Hai L. Nguyen
(74) *Attorney, Agent, or Firm*—Kolisch Hartwell, P.C.

(57) ABSTRACT

A digital electronic circuit having first and second sections. The first section is adapted to transmit one of N input signals. The second section is adapted to receive the signal transmitted by the first section and one or more control signals. The second section is configured to output either an inverse of the signal transmitted by the first section or a logical 0, or to output either an inverse of the signal transmitted by the first section or a logical 1. The second section also may be selectively configurable.

20 Claims, 10 Drawing Sheets

DIGITAL ELECTRONIC CIRCUIT FOR USE IN IMPLEMENTING DIGITAL LOGIC FUNCTIONS

CROSS-REFERENCE TO RELATED APPLICATION

This application is a continuation of U.S. patent application Ser. No. 09/477,153, filed Jan. 4, 2000 of Dzung Joseph Tran and Mark W. Acuff for DIGITAL ELECTRONIC CIRCUIT FOR USE IN IMPLEMENTING DIGITAL LOGIC FUNCTIONS, now U.S. Pat. No. 6,288,593.

FIELD OF THE INVENTION

The present invention relates to digital electronics, and more particularly to a digital electronic circuit for use in logic design.

BACKGROUND

Digital electronic circuits are used in virtually every modern electronic system, such as computers, watches and telephones. Under continuous pressure from users for increased functionality from electronic systems, designers and manufacturers of digital electronic circuits constantly strive to reduce the size and increase the performance of their circuits. Even modest gains in the density and/or performance of a circuit become substantial if the circuit is repeated many times within a system.

Traditionally, digital logic functions have been implemented with a plurality of discrete logic circuits or gates including AND gates, OR gates, NAND gates, NOR gates, etc., each constructed of several transistors. Subsequently, it was discovered that certain special purpose digital circuits such as multiplexers could be used to implement digital logic functions using fewer transistors than with discrete gates. In addition, improved multiplexers were developed which used even fewer transistors. These multiplexers, commonly known as "Transmission Gate" multiplexers, are described in my prior U.S. Pat. Nos. 5,040,139, 5,162,666, 5,200,907, and 5,548,231, the disclosures of which are herein incorporated by reference.

Figure 1:
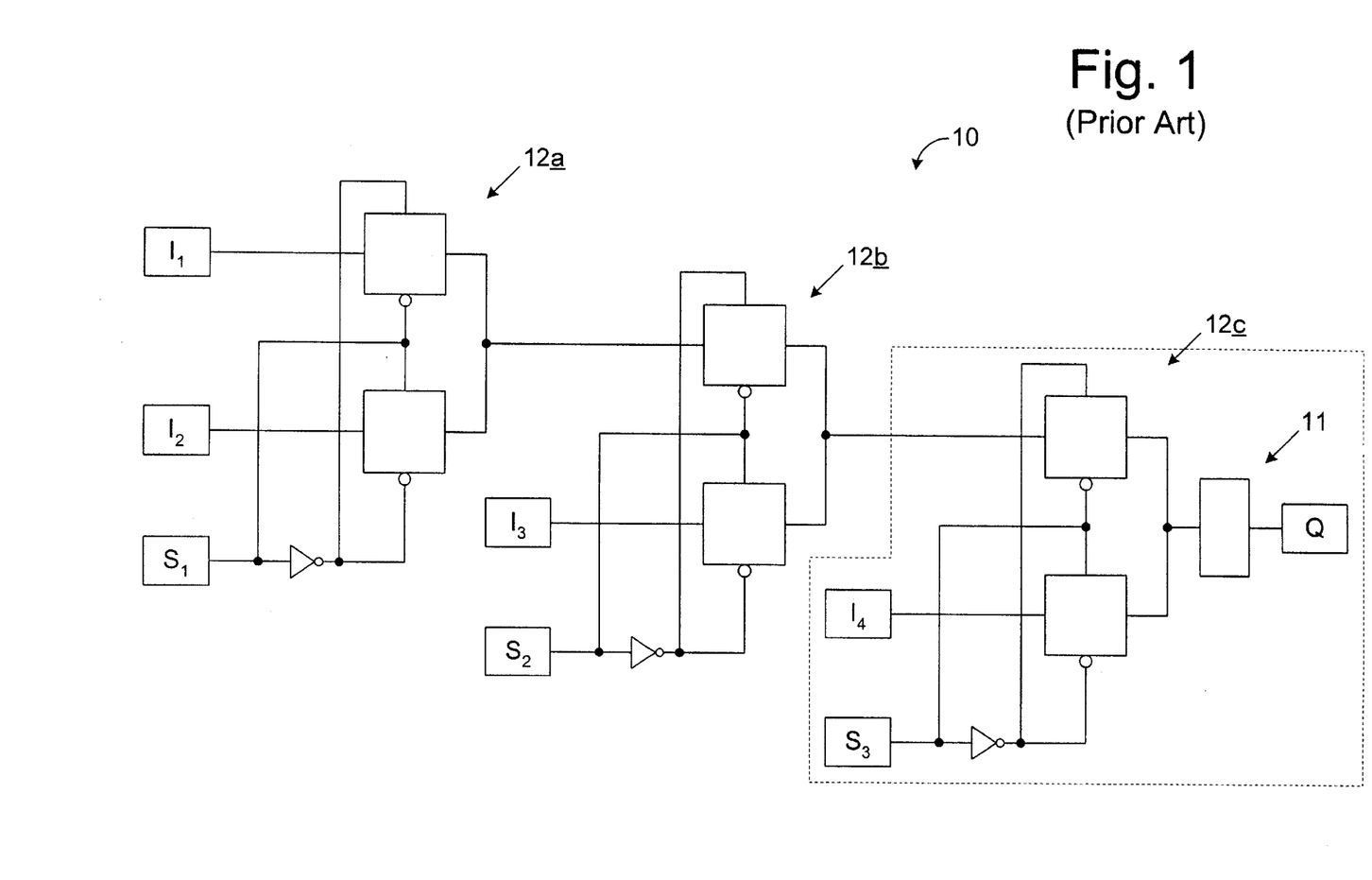
FIG. 1 is a schematic of an exemplary serial cascaded 4:1 TGM-based multiplexer with associated output driver, as is known in the art.

FIG. 1 shows an exemplary 4:1 transmission gate multiplexer 10 connected to an output driver 11. Transmission gate multiplexer 10 includes three 2:1 transmission gate multiplexers 12a–c connected in a serial cascading or hierarchical configuration, as described in my U.S. Pat. No. 5,162,666. The 2:1 transmission gate multiplexer (hereinafter referred to as a TGM) is the basic building block of larger transmission gate multiplexer systems. Each TGM is configured to receive two input signals $I_i$ and $I_{i+1}$, and a control signal $S_i$. The TGM selects one of the two input signals based on the logic value of control signal $S_i$. The selected input signal is transmitted to the output of the TGM, while the input signal not selected is blocked. The output of each TGM is connected to one of the inputs of the next higher TGM until final TGM 12c is reached. Thus, one of N input signals can be selected for transmission using N−1 TGM's connected in a hierarchical arrangement. The output of final TGM 12c typically is connected to an output driver 11 which is adapted to charge and discharge relatively large capacitive loads. The signal from output driver 11 is designated Q in FIG. 1.

Figure 2:
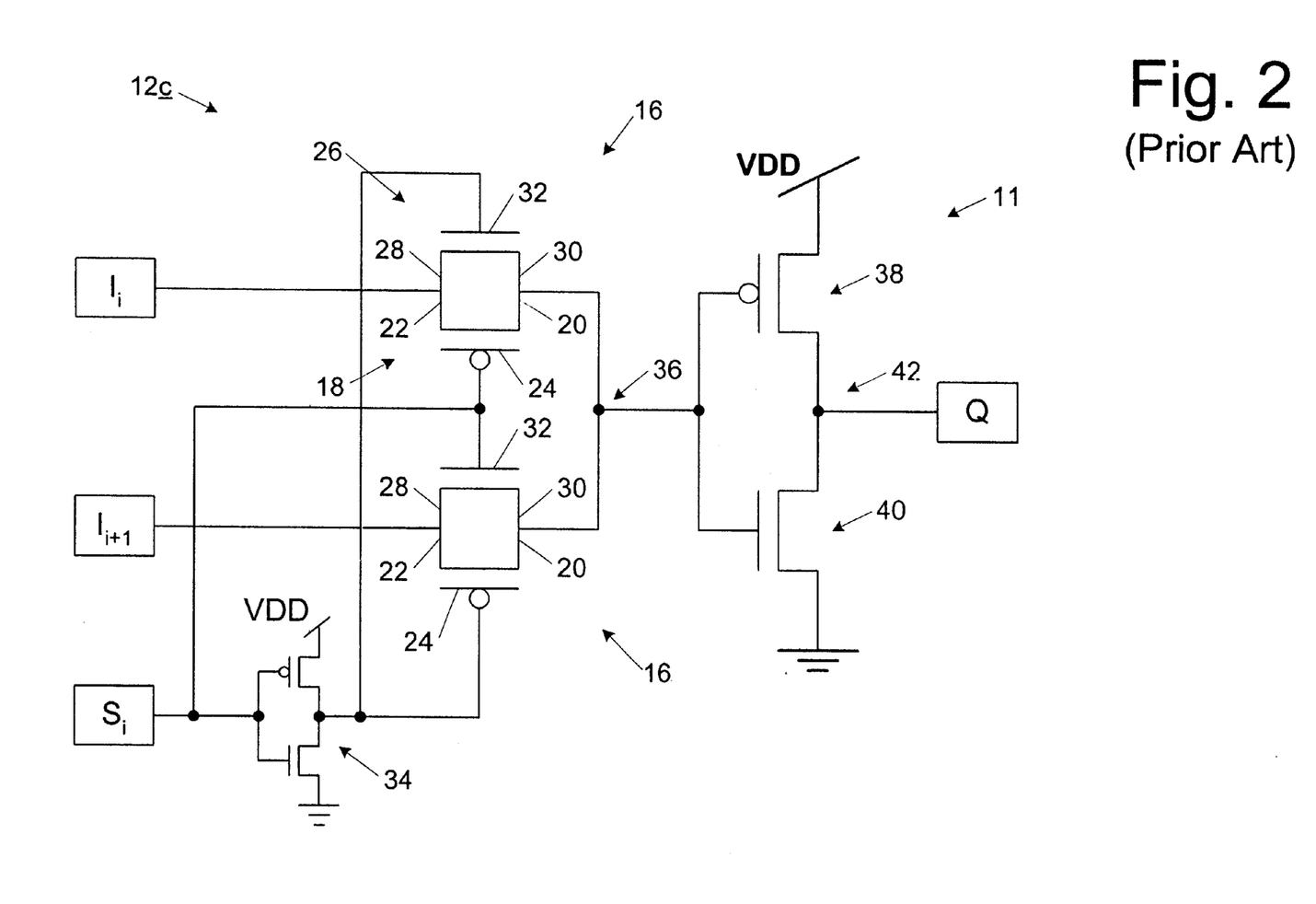
FIG. 2 is a schematic of an exemplary TGM and output driver, as is known in the art. The circuit shown in FIG. 2 corresponds to the portion of the multiplexer of FIG. 1 within the dashed lines.

FIG. 2 shows the construction of a typical TGM and output driver using Complimentary Metal Oxide Semiconductor (CMOS) technology. TGM 12c includes two transmission gate pairs 16, each having one P-channel transistor 18 with a drain 20, a source 22, and a gate 24, and one N-channel transistor 26 with a drain 28, a source 30, and a gate 32. The drain of each P-channel transistor is connected to the source of the corresponding N-channel transistor. Similarly, the source of each P-channel transistor is connected to the drain of the corresponding N-channel transistor.

The P-channel transistor will transmit a signal between the source and drain only when a negative voltage is applied to the gate with respect to the source. In contrast, the N-channel transistor will transmit a signal between the source and drain only when a positive voltage is applied to the gate with respect to the source. Thus, if opposite voltages are applied to the gates of the P-channel and N-channel transistor simultaneously, both transistors will either be switched "on" or switched "off."

A select signal $S_i$ is connected to the P-channel transistor of the first transmission gate pair and the N-channel transistor of the second transmission gate pair. The select signal is also passed through an inverter 34 which produces a signal opposite the select signal. Inverter 34 may be a conventional CMOS transistor pair connected between VDD and Ground, as is described in more detail below. The inverted select signal is connected to the N-channel transistor of the first transmission gate pair and the P-channel transistor of the second transmission gate pair. As a result, when $S_i$ is low (also referred to herein as "Ground" or "logical 0") the input signal $I_i$ connected to the first transmission gate pair is transmitted to the output node 36 of the TGM. Conversely, when $S_i$ is high (also referred to herein as "VDD" or "logical 1") the input signal $I_{i+1}$ connected to the second transmission gate pair is transmitted to output node 36.

The transmitted signal at output node 36 is connected to an output driver 11. Similar to inverter 34, the exemplary output driver shown in FIG. 2 is in the form of a CMOS inverter having one P-channel transistor 38 and one N-channel transistor 40. The P-channel transistor is connected between VDD and the N-channel transistor, while the N-channel transistor is connected between Ground and the P-channel transistor. The output node of the TGM is connected to the gates of transistors 38 and 40. The inverter output node 42 produces a signal Q opposite the transmitted signal. Transistors 38 and 40 are appropriately sized to drive the expected output load. As can be seen from FIG. 2, the combination of the final TGM and output driver uses eight transistors. If desired, the output driver may include two inverters connected in series to produce the transmitted signal without inversion.

In addition to the exemplary multiplexer described above, there are many other multiplexer configurations well known in the art. For example an N:1 multiplexer can be formed by arranging a plurality of TGM's in a tree-type hierarchical structure as is known in the art. As another example, multiplexers can be formed using traditional logic gates instead of transmission gates. In view of the wide-spread use of multiplexers to implement digital logic functions, an increase in multiplexer performance or a reduction in the number of transistors needed to form a multiplexer would constitute a substantial improvement over existing technology.

SUMMARY

The invention includes a digital electronic circuit for use in implementing digital logic functions. The invented circuit has first and second sections. The first section is adapted to transmit one of N input signals, and in some embodiments is a configuration of serial cascaded TGMs. The second section is adapted to receive the signal transmitted by the first section and one or more control signals. Additionally, the second section is configured to output either an inverse of the signal transmitted by the first section or a constant logic value in response to the one or more control signals. For example, in one embodiment the second section is adapted to output either an inverse of the signal transmitted by the first section or a logical 0. In another embodiment, the second section is adapted to output either an inverse of the signal transmitted by the first section or a logical 1. The second section also may be selectively configurable in either of these configurations. In one exemplary embodiment, the second section includes no more than six CMOS transistors. In another exemplary embodiment, the second section includes no more than four CMOS transistors.

DETAILED DESCRIPTION

Figure 3:
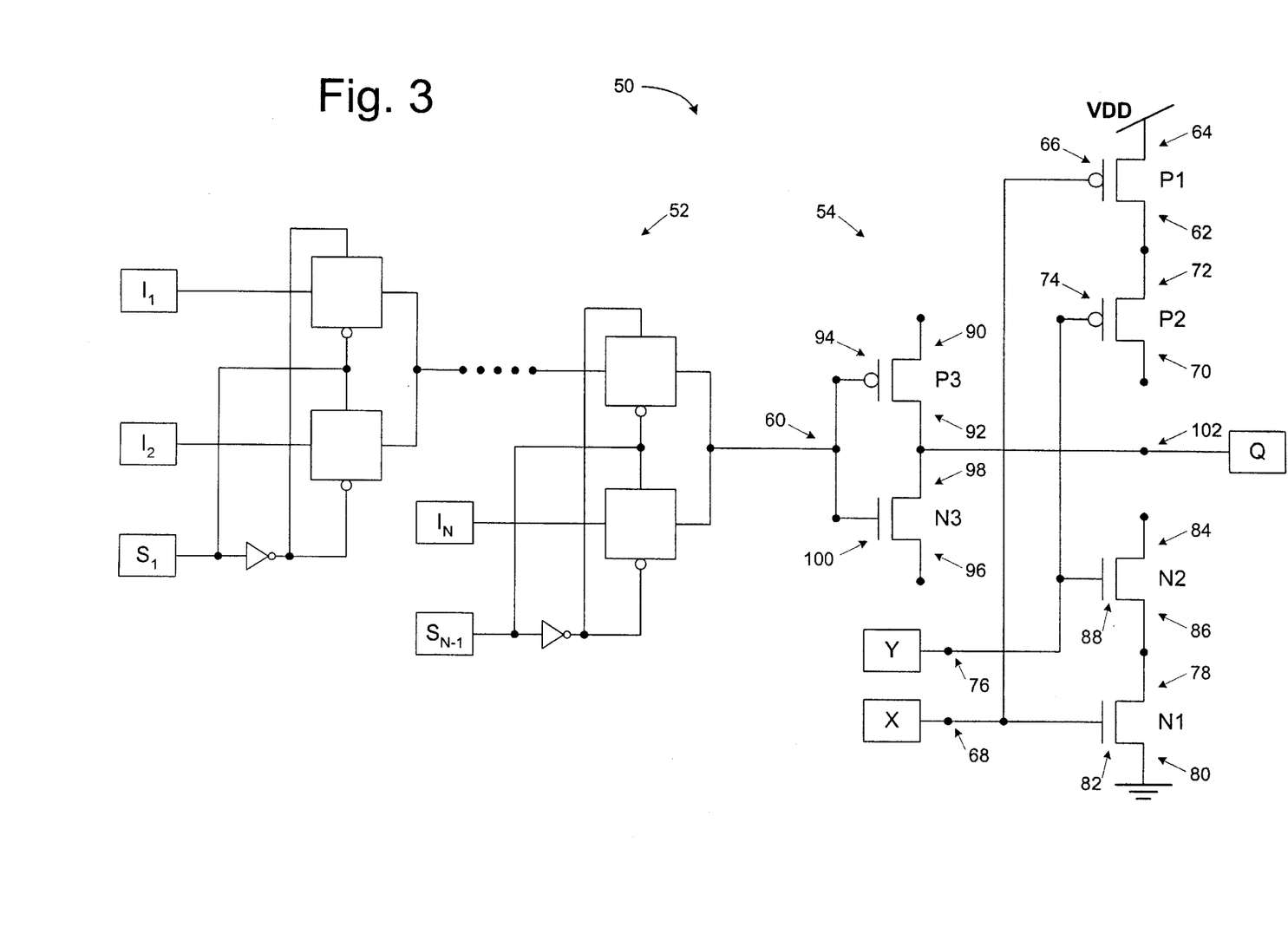
FIG. 3 is a schematic of a configurable circuit according to the present invention.

A digital electronic circuit for use in multiplexer-implemented logic is indicated generally at 50 in FIG. 3. Circuit 50 includes a first section 52 adapted to transmit one of N input signals, and a second section 54 associated with the first section. Second section 54 may take various configurations. In some configurations, second section 54 is adapted to output either an inverse of the signal transmitted by the first section or a logical 0 in response to one or more control signals. In other configurations, second section 54 is adapted to output either an inverse of the signal transmitted by the first section or a logical 1, in response to one or more control signals. The second section also may be made to be selectively configurable in one of the various configurations. In one exemplary application, second section 54 may be used to replace the final stage and output driver of a multiplexer logic circuit.

First section 52 is shown in FIG. 3 as an N:1 serial cascade multiplexer, such as depicted in FIGS. 1–2 and described above, but it may be any other circuit adapted to receive a plurality of input signals and to transmit a selected one of the plural input signals, such as a binary tree multiplexer or some other circuit. FIGS. 4–9 show first section 52 in block form to represent a N:1 serial cascade multiplexer as well as other circuits adapted to receive a plurality of input signals and to transmit a selected one of the plural input signals. Preferably first section 52 is a serial cascaded TGM multiplexer. Where first section 52 is a multiplexer, it typically will include N input signal nodes 56, each adapted to receive one of the N input signals $I_1$–$I_N$. For example, first section 52 may be a 2:1 multiplexer, or a 3:1 multiplexer, or a 4:1 multiplexer, or a 5:1 multiplexer, etc. First section 52 also may include one or more additional input or select nodes 58, adapted to receive one or more select signals. When first section 52 is a set of serial cascaded TGMs, having N inputs, the first section will include N−1 select signals, each of which goes to only one TGM and each of which is logically independent. First section 52 is adapted to transmit a selected one of the input signals $I_i$, depending on the value(s) of the one or more select signals, to output node 60.

Second section 54 includes a first P-channel/N-channel transistor pair (P1/N1) controllable by a first control signal X, and a second P-channel/N-channel transistor pair (P2/N2) controllable by a second control signal Y. Second section 54 also includes a third P-channel/N-channel transistor pair (P3/N3) controllable by the signal $I_i$ transmitted from the first section 52. The third P-channel/N-channel transistor pair function as an inverting output driver or output means for first section 52. The first and second P-channel/N-channel transistor pairs are interconnectable with the third P-channel/N-channel transistor pair, and function as a control means to either enable or disable the output driver in response to one or more control signals. When the output driver is disabled, thereby preventing transmission of the signal from first section 52, the second section outputs a constant logic value depending on its configuration. As used herein, the output driver is disabled when it cannot output one or more signals. For example, the output driver is disabled, as used herein, when it cannot output a logical 0, even if it can output a logical 1, or vice versa.

Thus, second section 54 functions similar to the combination of a final multiplexing stage (e.g., TGM 12c) and an output driver (e.g., output driver 11) by selecting between the output of the previous multiplexing stages and a separate logic value. However, a typical final multiplexing stage as described above selects between the output of prior stages and a separate value that is variable and determined by a final input signal. In contrast, second section 54 selects between the output of prior stages and a separate value that is constant and determined by the configuration of the second section rather than selecting between the output of prior stages and another variable input signal.

Second section 54 replaces the final multiplexing stage (the final TGM in a serial cascade multiplexer) and output driver. Replacing the final stage of a serial cascade TGM multiplexer and its associated output driver with a second section adapted to output a constant value rather than a input signal that is variable, although counter-intuitive because it reduces the number of variable inputs, does not limit the applicability of a circuit using second section 54. In fact, virtually any arbitrary digital logic function can be implemented with a suitable first section 52 connected to a second section 54 with fewer transistors than otherwise would be required. This is demonstrated by the following simple example.

Assume a digital logic designer wishes to implement an arbitrary three-variable function $A=f(X_1, X_2, X_3)$, where A can be expressed by the following truth table:

| $X_1$ | $X_2$ | $X_3$ | A |
|---|---|---|---|
| 0 | 0 | 0 | 1 |
| 0 | 0 | 1 | 0 |
| 0 | 1 | 0 | 0 |
| 0 | 1 | 1 | 1 |
| 1 | 0 | 0 | 1 |
| 1 | 0 | 1 | 0 |
| 1 | 1 | 0 | 0 |
| 1 | 1 | 1 | 0 |

This truth table can be reduced to the following, where the symbol $\overline{X_3}$ represents the logical inverse or opposite of signal $X_3$:

| $X_1$ | $X_2$ | A |
|---|---|---|
| 0 | 0 | $\overline{X_3}$ |
| 0 | 1 | $X_3$ |
| 1 | 0 | $\overline{X_3}$ |
| 1 | 1 | 0 |

Function A can be implemented with a 2:1 multiplexer first section that selects between the input signals $X_3$ and $\overline{X_3}$ depending on a select signal $X_2$, and a second stage that outputs a logical 0 when control signals X1 and X2 are each a logical 1.

Returning attention to FIG. 3, second section 54 is shown prior to being configured for operation. First P-channel transistor P1 includes a drain 62 and a source 64, which is connected to VDD. As used herein VDD represents a voltage level with respect to Ground suitable for the selected circuit technology. For example, where circuit 50 is constructed using CMOS technology, typical voltage levels for VDD include 5-volts, 2.5-volts, etc. However, it will be appreciated that the voltage level selected for VDD may vary depending on the application and changing circuit dimensions, and that circuit 50 is not limited to any particular voltage levels for VDD. In any event, first P-channel transistor P1 also includes a gate 66 connected to a first control signal node 68. Second P-channel transistor P2 includes a drain 70, a source 72 connected to drain 62 of transistor P1, and a gate 74 connected to a second control signal node 76. Drain 70 of transistor P2 is not connected when second section 54 is in an "unconfigured" state.

First N-channel transistor N1 includes a drain 78, a source 80 connected to Ground, and a gate 82 connected to first control signal node 68. Second N-channel transistor N2 includes a drain 84, a source 86 connected to drain 78 of transistor N1, and a gate 88 connected to second control signal node 76. Drain 84 of transistor N2 is not connected when second section 54 is in an "unconfigured" state.

Third P-channel transistor P3 includes a source 90, a drain 92, and a gate 94 connected to first section output node 60. Third N-channel transistor N3 includes a source 96, a drain 98 connected to drain 92 of transistor P3, and a gate 100 connected to first section output node 60. In addition, drain 92 of transistor P3 and drain 98 of transistor N3 are connected to a second section output node 102. Source 90 of transistor P3 and source 96 of transistor N3 are not connected when second section 54 is in an "unconfigured" or "selectively configurable" state.

Although shown in an unconfigured state in FIG. 3, second section 54 is configurable in any of a plurality of configurations by selectively interconnecting the transistors as described below. Typically, the second section will be configured to produce the desired logical function from a selected number of input and/or control signals. It will be appreciated that circuit 50 can be used in a variety of ways. For example, circuit 50 may be constructed in its unconfigured state as an application specific integrated circuit (ASIC) which is then selectively configured by interconnecting the transistors of the second section through a final metallization layer. As another example, circuit 50 can be used in digital logic design as a selectively configurable circuit layout cell which can be used to generate arbitrary logic functions. As another example, circuit 50 can be constructed as a programmable logic array (PLA) with fusible interconnections between the transistors of second section 54. In this latter example, a user can selectively configure the circuit by burning, melting, etc., the unwanted connections.

Figure 10:
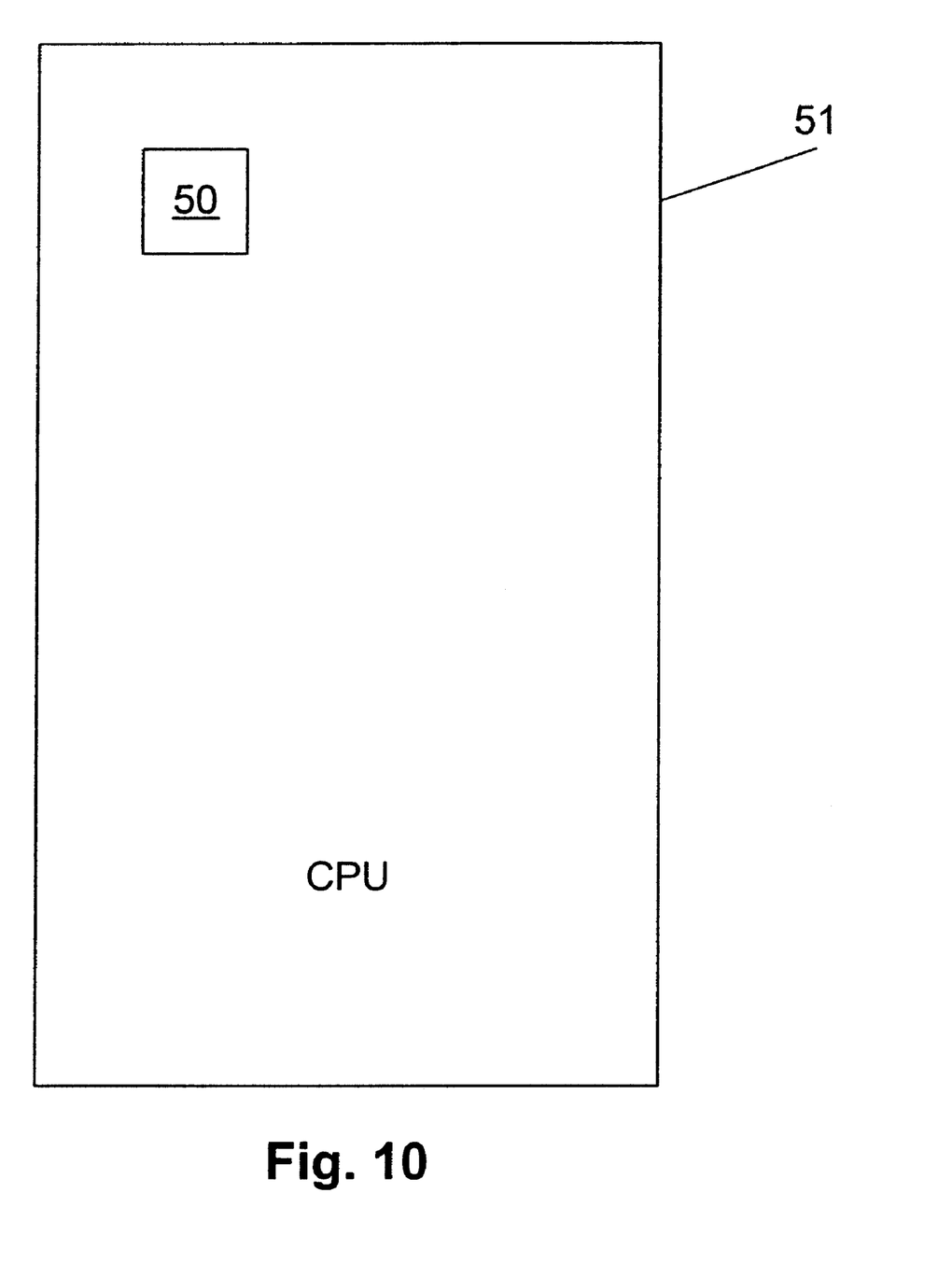
FIG. 10 shows an invented central processing unit.

Additionally, the various configurations of circuit 50, which will be described in more detail below, can be constructed separately to achieve the desired logic function in place of the multiplexer arrays described above. The various configurations preferably are formed as integrated circuits with first section 52 and second section 54 on a single substrate. This allows the circuit to perform faster and with less power dissipation than circuits that achieve similar logic functions through multiple, deserete integrated circuits. This also allows the circuit to have a smaller physical size or area. The configurations may be formed on the single substrate as a central processing unit (CPU) and/or with other circuitry, as would be known by a person of ordinary skill in the art. A single semiconductor substrate 51 showing the invention as a CPU is shown in FIG. 10.

Figure 4:
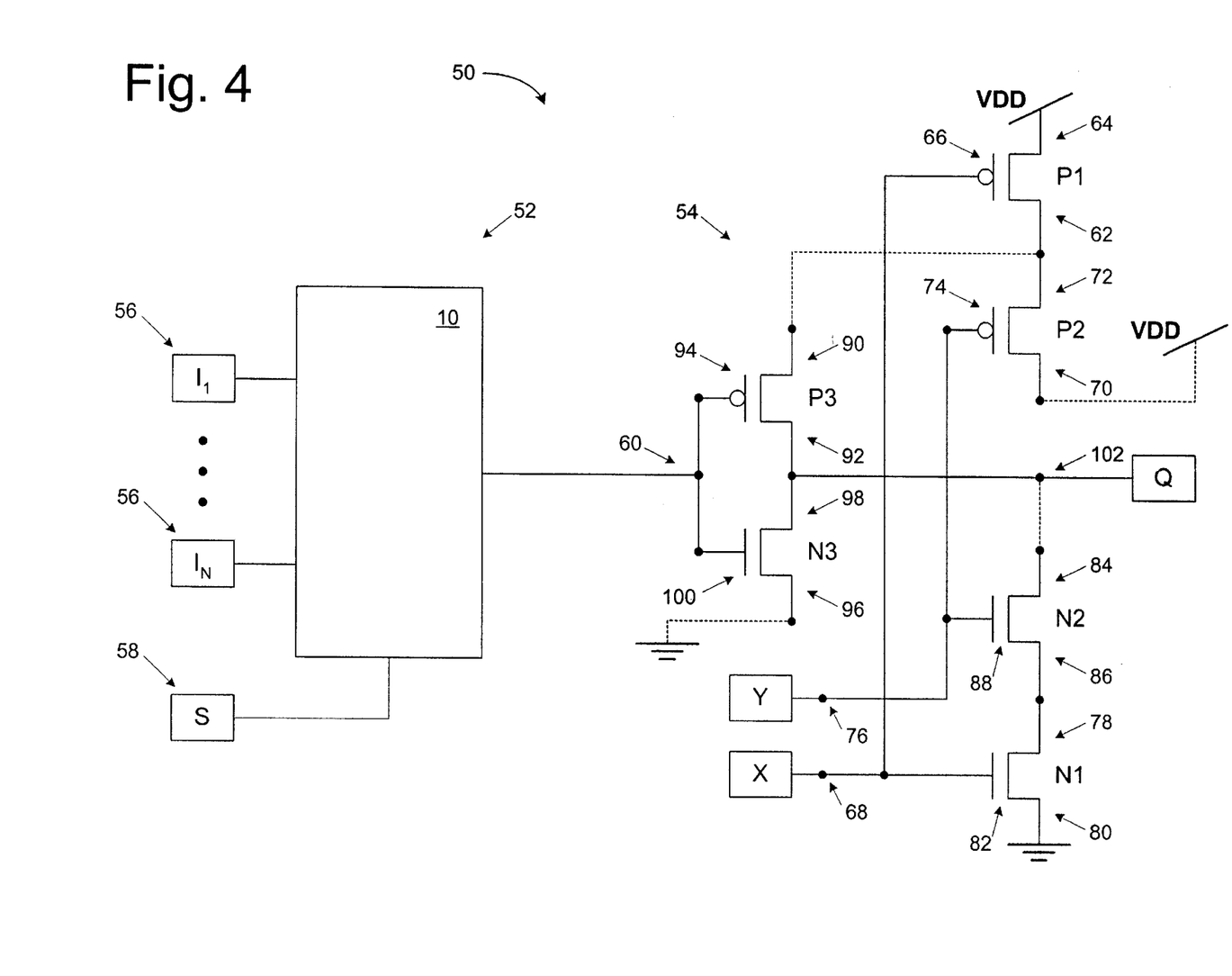
FIG. 4 is a schematic of the circuit of FIG. 3 configured to output either an inverse of a signal transmitted by a multiplexer or a logical 0 in response to two control signals.

FIG. 4 depicts circuit 50 in which the transistors of second section 54 are interconnected to form a first configuration. As shown, second section 54 is configured in the first configuration by connecting drain 62 of transistor P1 to source 90 of transistor P3, connecting drain 70 of transistor P2 to VDD, connecting drain 84 of transistor N2 to second section output node 102, and connecting source 96 of transistor N3 to Ground.

When at least one of control signal X or Y is a 0, then at least one of transistor P1 or P2 will be switched on, respectively. Thus, source 90 of transistor P3 will be connected to VDD. In addition, at least one of transistor N1 or N2 will be switched off, isolating output node 102 from Ground. Since source 96 of transistor N3 is connected to Ground, the output driver formed by transistors P3 and N3 is enabled and outputs to output node 102 the inverse of the signal transmitted by first section 52.

Conversely, when both control signals X and Y are a 1, then both transistors P1 and P2 will be switched off, isolating source 90 of transistor P3 from VDD. The P3/N3 output driver is therefore disabled (i.e., it cannot output a logical 1 even though it can output a logical 0) and the signal transmitted by the first section is blocked. However, both of transistors N1 and N2 will be switched on, connecting output node 102 to Ground. It will be appreciated that the logical function performed by second section 54 in the first configuration can be expressed by the Boolean equation Q= $\overline{I+XY}$, where Q is the output signal of circuit 50 at output node 102, and I is the signal transmitted by first section 52 to output node 60.

The logical function performed by second section 54 in the first configuration can also be expressed by a truth table.

For example, where first section 52 is a 2:1 multiplexer adapted to transmit one of two input signals $I_1$, $I_2$ depending on a select signal S, the output signal Q at output node 102 can be expressed by:

| S | X | Y | Q |
|---|---|---|---|
| 0 | 0 | 0 | $\overline{I_1}$ |
| 0 | 0 | 1 | $\overline{I_1}$ |
| 0 | 1 | 0 | $\overline{I_1}$ |
| 0 | 1 | 1 | 0 |
| 1 | 0 | 0 | $\overline{I_2}$ |
| 1 | 0 | 1 | $\overline{I_2}$ |
| 1 | 1 | 0 | $\overline{I_2}$ |
| 1 | 1 | 1 | 0 |

As demonstrated by the Boolean equation and truth table above, second section 54 is configurable to replace the final stage and output driver in a multiplexer logic circuit in which the output of the circuit is a constant 0 for a particular combination of input, select, and/or control signals. Furthermore, second section 54 achieves this function with no more than six CMOS transistors (three P-channel/N-channel transistor pairs). In contrast, the final stage and output driver shown in FIG. 2 use at least eight transistors. It will be understood by those of skill in the art that this 25% reduction in the number of transistors leads to substantial improvements in circuit density, propagation delay, power dissipation, etc.

Figure 5:
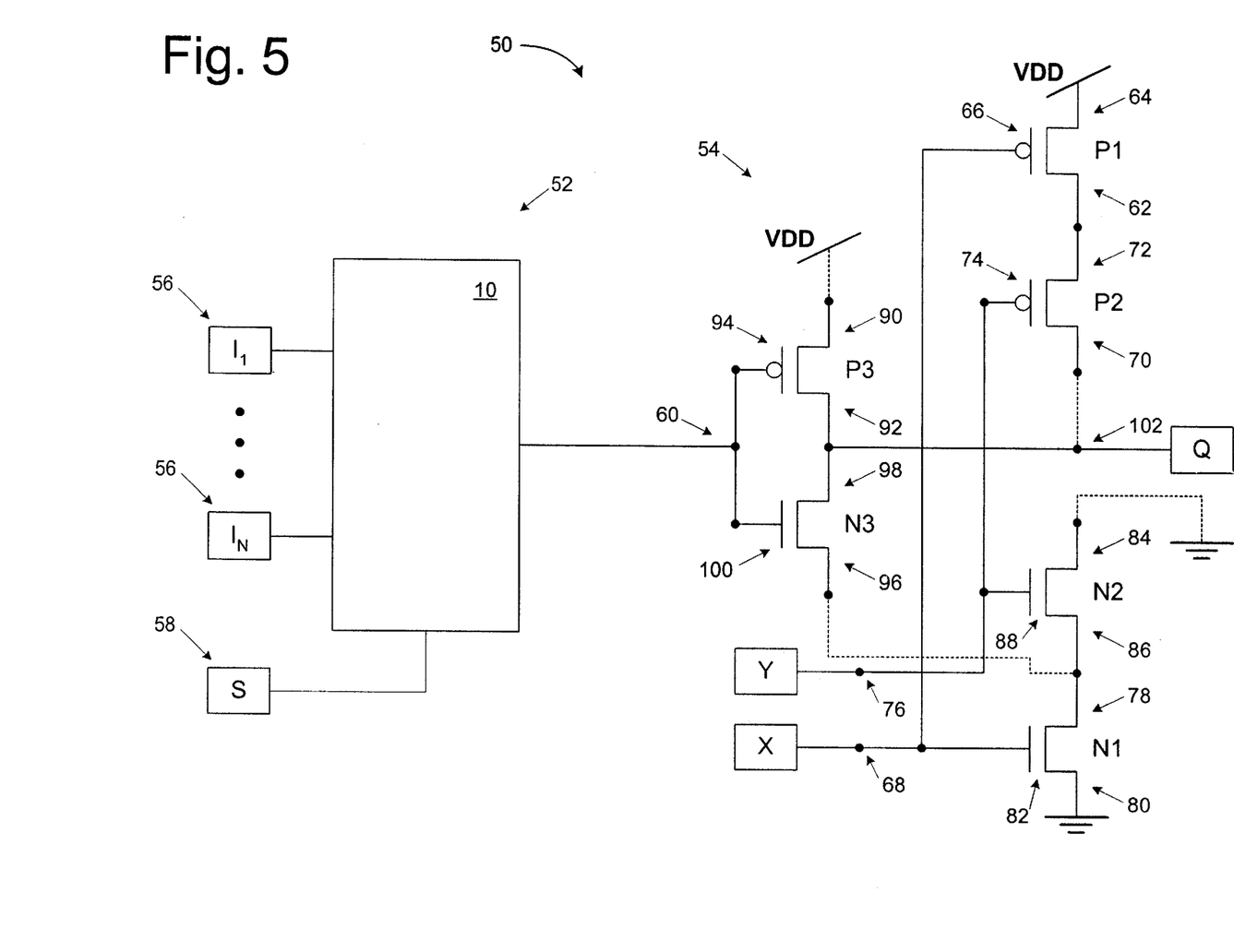
FIG. 5 is a schematic of the circuit of FIG. 3 configured to output either an inverse of a signal transmitted by a multiplexer or a logical 1 in response to two control signals.

Turning now to FIG. 5, the transistors of second section 54 are shown interconnected to form a second configuration. Second section 54 is configured in the second configuration by connecting drain 70 of transistor P2 to second section output node 102, connecting drain 84 of transistor N2 to Ground, connecting source 90 of transistor P3 to VDD, and connecting source 96 of transistor N3 to drain 78 of transistor N1.

When at least one of control signal X or Y is a 1, then at least one of transistor N1 or N2 will be switched on, respectively. Thus, source 96 of transistor N3 will be connected to Ground. In addition, at least one of transistor P1 or P2 will be switched off, isolating output node 102 from VDD. Since source 90 of transistor P3 is connected to VDD, the output driver formed by transistors P3 and N3 is enabled and outputs to output node 102 the inverse of the signal transmitted by first section 52.

Conversely, when both control signals X and Y are a 0, then both transistors N1 and N2 will be switched off, isolating source 96 of transistor N3 from Ground. The P3/N3 output driver is therefore disabled (i.e., it cannot output a logical 0 even though it can output a logical 1) and the signal transmitted by the first section is blocked. However, both of transistors P1 and P2 will be switched on, connecting output node 102 to VDD. It will be appreciated that the logical function performed by second section 54 in the second configuration can be expressed by the Boolean equation $Q=\overline{I}(X+Y)$, where Q is the output signal of circuit 50 at output node 102, and I is the signal transmitted by first section 52 to output node 60.

The logical function performed by second section 54 in the second configuration can also be expressed by a truth table. For example, where first section 52 is a 2:1 multiplexer adapted to transmit one of two input signals $I_1$, $I_2$ depending on a select signal S, the output signal Q at output node 102 can be expressed by:

| S | X | Y | Q |
|---|---|---|---|
| 0 | 0 | 0 | 1 |
| 0 | 0 | 1 | $\overline{I_1}$ |
| 0 | 1 | 0 | $\overline{I_1}$ |
| 0 | 1 | 1 | $\overline{I_1}$ |
| 1 | 0 | 0 | 1 |
| 1 | 0 | 1 | $\overline{I_2}$ |
| 1 | 1 | 0 | $\overline{I_2}$ |
| 1 | 1 | 1 | $\overline{I_2}$ |

Thus, second section 54 is configurable to replace the final stage and output driver in a multiplexer logic circuit in which the output of the circuit is a constant 1 for a particular combination of input, select, and/or control signals. As with the first configuration, second section 54 achieves this function with no more than six CMOS transistors (three P-channel/N-channel transistor pairs). Furthermore, second section 54 is selectively configurable in either the first or second configurations as required for a particular application.

Figure 6:
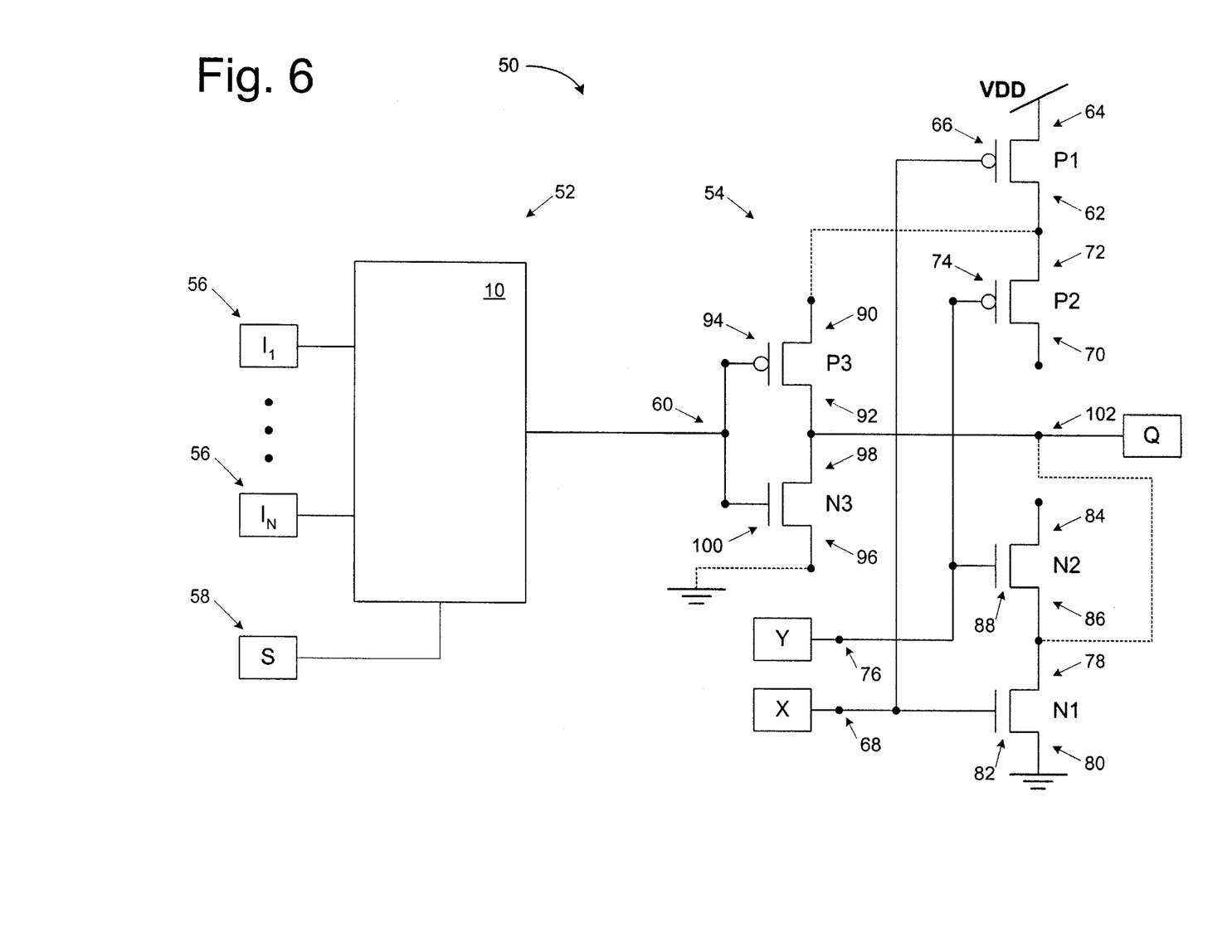
FIG. 6 is a schematic of the circuit of FIG. 3 configured to output either an inverse of a signal transmitted by a multiplexer or a logical 0 in response to one control signal.

As shown in FIG. 6, second section 54 is also selectively configurable in a third configuration. Similar to the first configuration, second section 54 outputs either an inverse of the signal transmitted by first section 52 or a logical 0 when configured in the third configuration. However, the third configuration is different than either the first or second configurations. The second section is configured in the third configuration by connecting drain 62 of transistor P1 to source 90 of transistor P3, connecting drain 78 of transistor N1 to second section output node 102, and connecting source 96 of transistor N3 to Ground.

Figure 7:
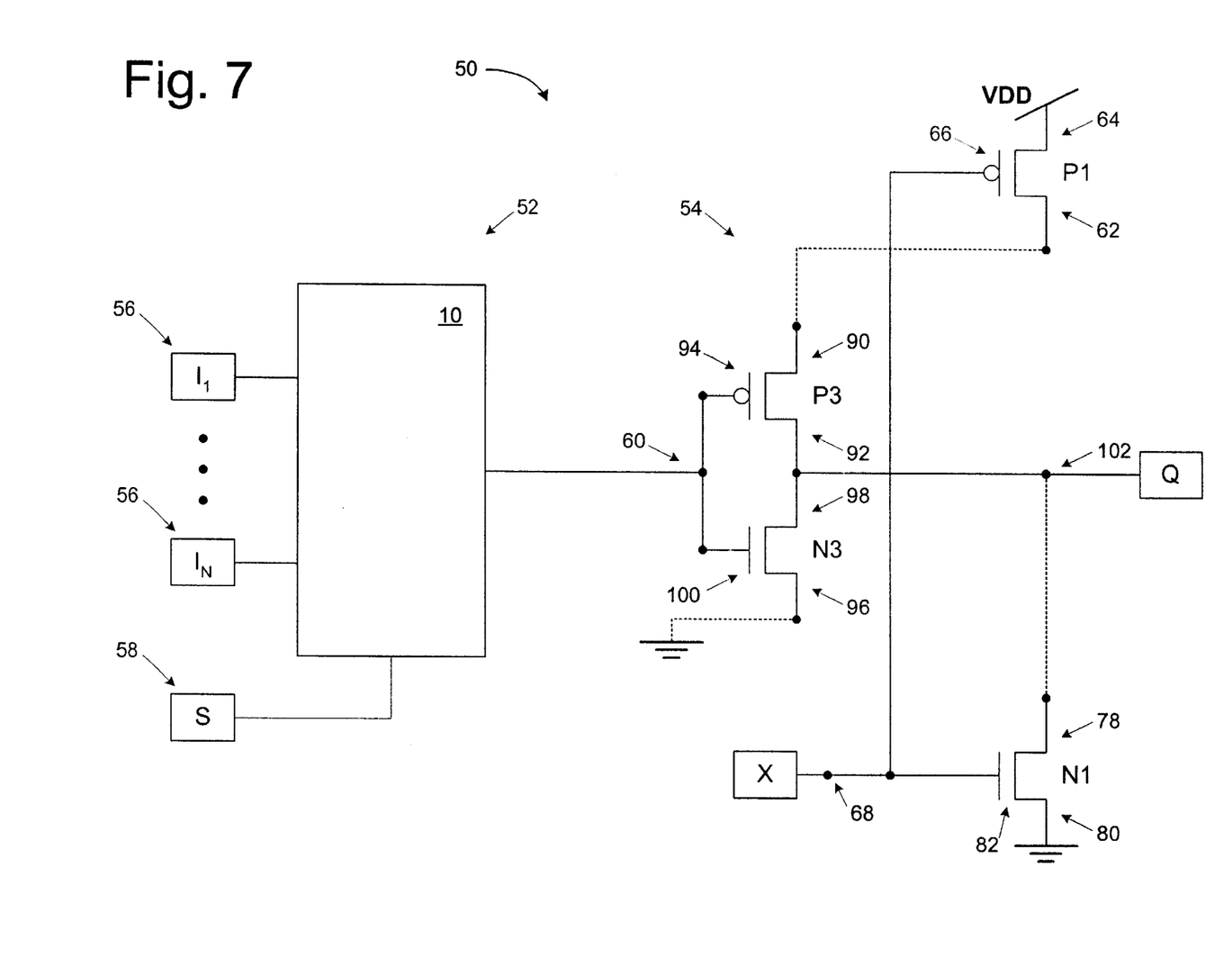
FIG. 7 shows another configuration of the invention.

The drains of transistors P2 and N2 are not connected when the second section is in the third configuration. Thus, transistors P2 and N2 are inoperative. To prevent parasitic effects due to floating voltages, second control signal node 76 typically is connected either to VDD or to Ground. Alternatively, transistors P2 and N2 and control node 76, may be omitted from second section 54 so that second section 54 uses no more than four CMOS transistors (two P-channel/N-channel transistor pairs), as shown in FIG. 7.

When control signal X is a 1, transistor P1 is switched off, isolating source 90 of transistor P3 from VDD. The output driver formed by transistors P3 and N3 is therefore disabled (i.e., it cannot output a logical 1 even though it can output a logical 0) and the signal transmitted by the first section is blocked. However, transistor N1 is switched on, connecting output node 102 to Ground. Conversely, when control signal X is a 0, transistor P1 is switched on, connecting source 90 of transistor P3 to VDD. In addition, transistor N1 is switched off, isolating output node 102 from Ground. Since source 96 of transistor N3 is connected to Ground, the P3/N3 output driver is enabled and outputs the inverse of the signal transmitted by first section 52 to output node 102.

It will be appreciated that the logical function performed by second section 54 in the third configuration can be expressed by the Boolean equation $Q=\overline{I+X}$, where Q is the output signal of circuit 50 at output node 102, and I is the signal transmitted by first section 52 to output node 60. The logical function performed by second section 54 in the third configuration can also be expressed by a truth table. For example, where first section 52 is a 2:1 multiplexer adapted to transmit one of two input signals $I_1$, $I_2$ depending on a select signal S, the output signal Q at output node 102 can be expressed as follows, where control signal Y is not used:

| S | X | Y | Q |
|---|---|---|---|
| 0 | 0 | — | $\overline{I_1}$ |
| 0 | 1 | — | 0 |
| 1 | 0 | — | $\overline{I_2}$ |
| 1 | 1 | — | 0 |

Thus, second section 54 is configurable in the third configuration to output either an inverse of the signal transmitted by the first section or a logical 0 in response to only one control signal.

Figure 8:
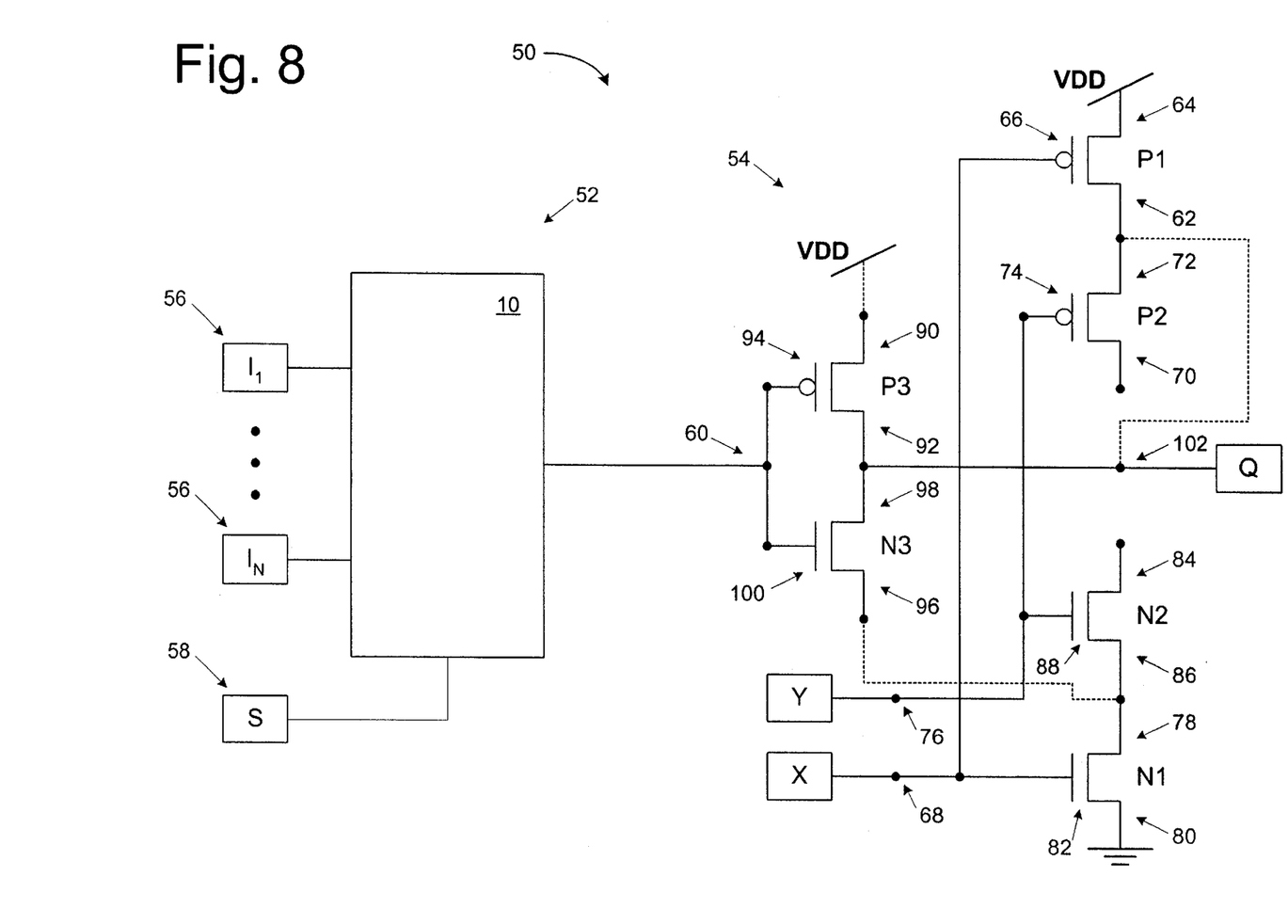
FIG. 8 is a schematic of the circuit of FIG. 3 configured to output either an inverse of a signal transmitted by a multiplexer or a logical 1 in response to one control signal.

Turning now to FIG. 8, it can be seen that second section 54 is selectively configurable in a fourth configuration to output either an inverse of the signal transmitted by the first section or a logical 1. The fourth configuration is different than any of the first, second, or third configurations. The second section is configured in the fourth configuration by connecting drain 62 of transistor P1 to second section output node 102, connecting source 90 of transistor P3 to VDD, and connecting source 96 of transistor N3 to drain 78 of transistor N1.

Figure 9:
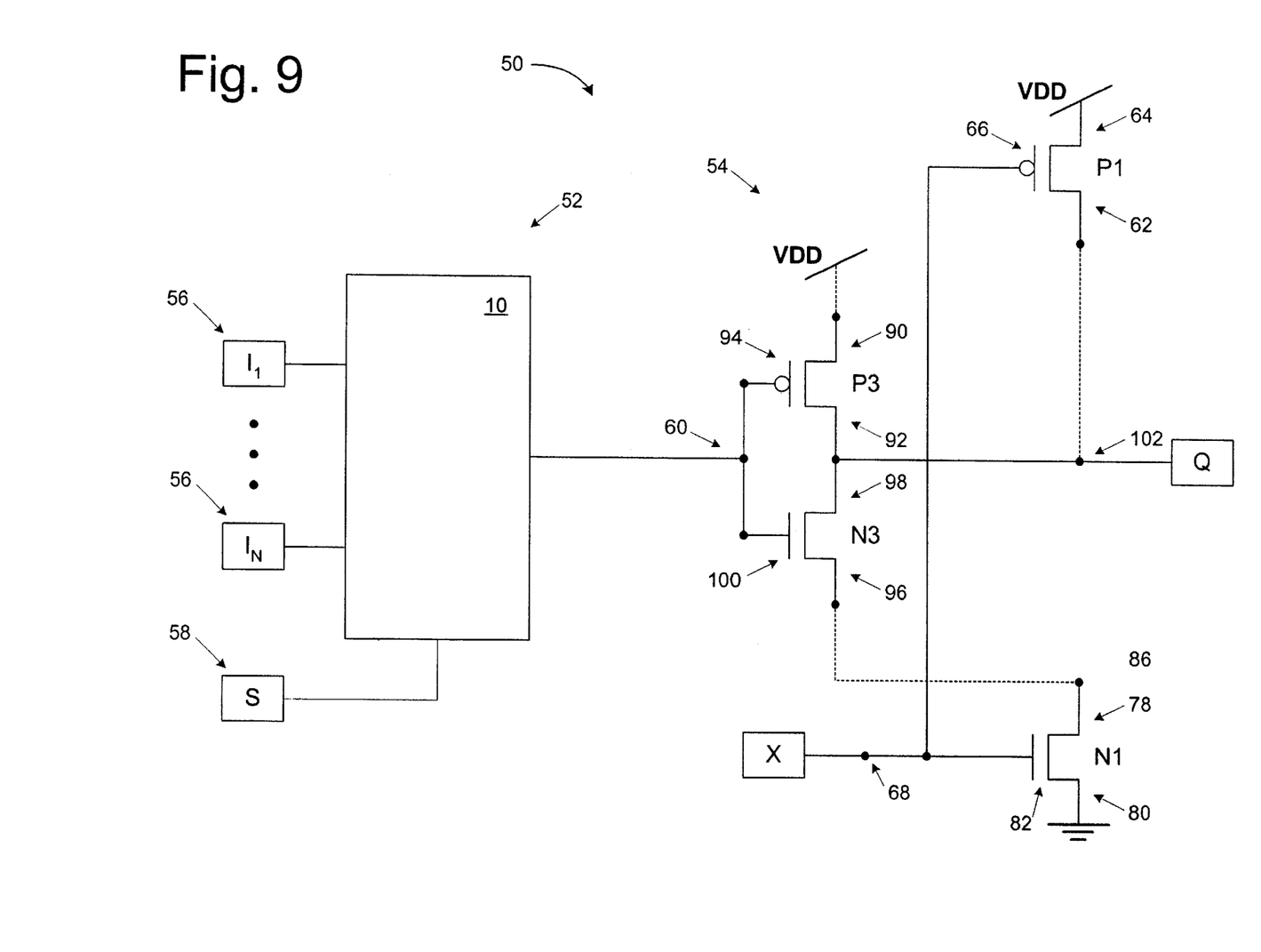
FIG. 9 shows another configuration of the invention.

As in the third configuration, the drains of transistors P2 and N2 are not connected when the second section is in the fourth configuration. Thus, transistors P2 and N2 are inoperative and the second control signal node 76 typically is connected to either VDD or Ground. Alternatively, transistors P2 and N2 and control signal node 76 may be omitted from second section 54, leaving only four CMOS transistors needed to achieve the function of the second section, as shown in FIG. 9.

In any event, when control signal X is a 0, transistor N1 is switched off, isolating source 96 of transistor N3 from Ground. The output driver formed by transistors P3 and N3 is therefore disabled (i.e., it cannot output a logical 0 even though it can output a logical 1) and the signal transmitted by the first section is blocked. However, transistor P1 is switched on, connecting output node 102 to VDD. Conversely, when control signal X is a 1, transistor N1 is switched on, connecting source 96 of transistor N3 to Ground. In addition, transistor P1 is switched off, isolating output node 102 from VDD. Since source 90 of transistor P3 is connected to VDD, the P3/N3 output driver is enabled and outputs to output node 102 the inverse of the signal transmitted by first section 52.

It will be appreciated that the logical function performed by second section 54 in the fourth configuration can be expressed by the Boolean equation Q=$\overline{IX}$, where Q is the output signal of circuit 50 at output node 102, and I is the signal transmitted by first section 52 to output node 60. The logical function performed by second section 54 in the fourth configuration can also be expressed by a truth table. For example, where first section 52 is a 2:1 multiplexer adapted to transmit one of two input signals $I_1$, $I_2$ depending on a select signal S, the output signal Q at output node 102 can be expressed as follows where control signal Y is not used:

| $S_1$ | X | Y | Q |
|---|---|---|---|
| 0 | 0 | — | 1 |
| 0 | 1 | — | $\overline{I_1}$ |
| 1 | 0 | — | 1 |

-continued

| $S_1$ | X | Y | Q |
|---|---|---|---|
| 1 | 1 | — | $\overline{I_2}$ |

Thus, second section 54 is configurable in the fourth configuration to output either an inverse of the signal transmitted by the first section or a logical 1 in response to only one control signal.

A significant feature of each configuration of second section 54 described above and as shown in the figures, is that the output of the second section is determined without feedback. In other words, second section output node 102 is not connected to the gate of any transistor in circuit 50, and specifically not to an input of one of the TGMs or multiplexing stages of the first section, so the signal at output node 102 is not fed back into circuit 50. This is in contrast to other circuit designs, such as flip-flops, which use the output signal as an input to one or more transistor gates. The use of feedback in a circuit may slow th speed of the circuit since a feedback signal is first transmitted through a circuit to an output, and then returned to an input node, and then transmitted through at lease a portion of the circuit again. This repeated transmission of a feedback signal through a circuit may cause delay in generating a final output signal. Therefore, the absence of feedback in circuit 50 maximizes the speed of the circuit.

As discussed above, first section 52 may be any suitable circuit adapted to transmit a selected one of N input signals. For example, first section 52 may be a TGM multiplexer having one or more TGM's connected in a serial cascading hierarchy where the output of each TGM (except the final TGM) is connected to one of the inputs of the next higher TGM in the hierarchy. This particular configuration of first section 52 offers additional benefits over other first circuit configurations.

For instance, a serial cascade TGM structure minimizes internal feedback and fan-out of the input signals by ensuring that the output of each TGM is connected to only one P-channel/N-channel transmission gate pair. This reduces the propagation delay of the input signals by reducing the loading on the TGM outputs. In contrast, other TGM arrangements such as EXCLUSIVE OR gates and EXCLUSIVE NOR gates are configured so that the output of at least one TGM is connected to a plurality of P-channel/N-channel transmission gate pairs. Similarly, the serial cascade structure ensures that each select signal drives only a single TGM rather than multiple TGM's. This reduces the loading on the select signal nodes, thereby decreasing propagation delay of the select signals. In contrast, most select signals used in tree-type hierarchical structures must control multiple TGM's. Thus, the minimization of internal feedback and fan-out and the use of individual select lines in a serial cascaded multiplexer combined with a second section as described above results in a faster circuit. It also results in a circuit that has less power dissipation and that occupies less area.

As described above, circuit 50 can be used by digital logic designers in place of conventional multiplexer function generators. After using known techniques to determine a plurality of digital output values Q, one for each combination of digital input values, the logic designer can select an appropriate circuit 50 having a first section adapted to transmit a selected one of N input signals. If necessary, the designer may develop a truth table (such as those described above) depicting the desired logical function, and use known techniques to determine how to implement the function using multiplexer logic. Finally, the designer configures the second section to produce the desired output value based on the input signals by interconnecting the transistors of the second section as described above.

While the invention has been disclosed in its preferred forms, the specific embodiments thereof as disclosed and illustrated herein are not to be considered in a limiting sense. Applicants regard the subject matter of the invention to include all novel and non-obvious combinations and sub-combinations of the various elements, features, functions and/or properties disclosed herein. The following claims define certain combinations and subcombinations which are regarded as novel and non-obvious. Other perspectives, combinations and subcombinations of features, functions, elements and/or properties may be claimed through amendment of the present claims or presentation of new claims in this or a related application. Such claims, whether they are different, broader, narrower or equal in scope to the original claims, are also regarded as included within the subject matter of applicants' invention.

We claim:

1. A digital electronic circuit comprising:
   a first section adapted to transmit one of N input signals; and
   a second section associated with the first section to receive the signal transmitted by the first section, where the second section includes a first P-channel/N-channel transistor pair controllable by a first control signal, a second P-channel/N-channel transistor pair controllable by a second control signal, and a third P-channel/N-channel transistor pair controllable by the signal transmitted by the first section;
   where the second section is selectively configurable either to output an inverse of the signal transmitted by the first section or a logical 0 in reponse to the control signals, or to output an inverse of the signal transmitted by the first section or a logical 1 in response to the control signals.

2. The circuit of claim 1, wherein each transistor includes a drain and a source, and wherein the source of the first P-channel transistor is connected to VDD, the source of the first N-channel transistor is connected to Ground, the drain of the first P-channel transistor is connected to the source of the second P-channel transistor, the drain of the first N-channel transistor is connected to the source of the second N-channel transistor, and the drain of the third P-channel transistor is connected to the drain of the third N-channel transistor.

3. The circuit of claim 2, wherein the first section comprises an N:1 TGM multiplexer having N-1 NGM's connected in series so that the output of each TGM except a final TGM is connected to an input of the next TGM in the series.

4. The circuit of claim 2, wherein the second section is configurable to output an inverse of the signal transmitted by the first section or a logical 0 in response to the first and second control signals by coupling the source of the third P-channel transistor to the drain of the first P-channel transistor, coupling the source of the third N-channel transistor to Ground, coupling the drain of the second P-channel transistor to VDD, and coupling the drain of the second N-channel transistor to the drain of the third N-channel transistor.

5. The circuit of claim 2, wherein the second section is configurable to output an inverse of the signal transmitted by the first section or a logical 1 in response to the first and second control signals by coupling the source of the third P-channel transistor to VDD, coupling the source of the third N-channel transistor to the drain of the first N-channel transistor, coupling the drain of the second P-channel transistor to the drain of the third N-channel transistor, and coupling the drain of the second N-channel transistor to Ground.

6. The circuit of claim 2, wherein the second section is configurable to output an inverse of the signal transmitted by the first section or a logical 0 in response to the first control signal to coupling the source of the third P-channel transistor to the drain of the first P-channel transistor, coupling the source of the third N-channel transistor to Ground, coupling the drain of the first N-channel transistor to the drain of the third N-channel transistor, and coupling the second control signal either to VDD or to Ground.

7. The circuit of claim 2, wherein the second section is configurable to output an inverse of the signal transmitted by the first section or a logical 1 in response to the first control signal by coupling the source of the third P-channel transistor to VDD, coupling the source of the third N-channel transistor to the drain of the first N-channel transistor, coupling the drain of the first P-channel transistor to the drain of the third P-channel transistor, and coupling the second control signal either to VDD or to Ground.

8. A CMOS digital electronic circuit, comprising:
   a first section adapted to transmit one of N input signals; and
   a second adapted to receive the signal transmitted by the first section, a first control signal, and a second control signal;
   wherein the second section includes no more than six transistors and an output node, and
   wherein the second section is selectively configurable to output a signal Q to the output node corresponding to one of the following Boolean equations:

$$Q=\overline{I+XY} \quad Q=\overline{I(X+Y)} \quad Q=\overline{I+X} \quad Q=\overline{IX}$$

where I is the signal transmitted by the first section, X is the first control signal, and Y is the second control signal.

9. The circuit of claim 8, wherein the second section is configurable to output signal Q to the output node without feedback of Q into the second section.

10. A method of digital electronic circuit design to produce desired digital output values in response to combinations of five digital input values (I1, I2, S1, X, Y), the method comprising:
    deciding upon a plurality of digital output values Q, one for each combination of digital input values;
    selecting a CMOS circuit having at least one selectively configurable section comprising no more than twelve transistors, wherein the section includes five input signal nodes and at least one output signal node;
    configuring the section to output Q at the output signal node according to the combination of digital input values at the corresponding input signal nodes; and
    wherein Q is represented by the following truth table:

| $S_1$ | X | Y | Q |
|---|---|---|---|
| 0 | 0 | 0 | $\overline{I_1}$ |
| 0 | 0 | 1 | $\overline{I_1}$ |
| 0 | 1 | 0 | $\overline{I_1}$ |

-continued

| S₁ | X | Y | Q |
|---|---|---|---|
| 0 | 1 | 1 | 0 |
| 1 | 0 | 0 | $\overline{I_2}$ |
| 1 | 0 | 1 | $\overline{I_2}$ |
| 1 | 1 | 0 | $\overline{I_2}$ |
| 1 | 1 | 1 | 0. |

11. A method of digital electronic circuit design to produce desired digital output values in response to combinations of five digital input values (I1, I2, S1, X, Y), the method comprising:
deciding upon a plurality of digital output values Q, one for each combination of digital input values;
selecting a CMOS circuit having at least one selectively configurable section comprising no more than twelve transistors, wherein the section includes five input signal nodes and at least one output signal node;
configuring the section to output Q at the output signal node according to the combination of digital input values at the corresponding input signal nodes; and
wherein Q is represented by the following truth table:

| S₁ | X | Y | Q |
|---|---|---|---|
| 0 | 0 | 0 | 1 |
| 0 | 0 | 1 | $\overline{I_1}$ |
| 0 | 1 | 0 | $\overline{I_1}$ |
| 0 | 1 | 1 | $\overline{I_1}$ |
| 1 | 0 | 0 | 1 |
| 1 | 0 | 1 | $\overline{I_2}$ |
| 1 | 1 | 0 | $\overline{I_2}$ |
| 1 | 1 | 1 | $\overline{I_2}$. |

12. A method of digital electronic circuit design to produce desired digital output values in response to combinations of five digital input values (I1, I2, S1, X, Y), the method comprising:
deciding upon a plurality of digital output values Q, one for each combination of digital input values;
selecting a CMOS circuit having at least one selectively configurable section comprising no more than twelve transistors, wherein the section includes five input signal nodes and at least one output signal node;
configuring the section to output Q at the output signal node according to the combination of digital input values at the corresponding input signal nodes; and
wherein Q is represented by the following truth table:

| S₁ | X | Y | Q |
|---|---|---|---|
| 0 | 0 | — | $\overline{I_1}$ |
| 0 | 1 | — | 0 |
| 1 | 0 | — | $\overline{I_2}$ |
| 1 | 1 | — | 0. |

13. A method of digital electronic circuit design to produce desired digital output values in response to combinations of five input values (I1, I2, S1, X, Y), the method comprising:
deciding upon a plurality of digital output values Q, one for each combination of digital input values;
selecting a CMOS circuit having at least one selectively configurable section comprising no more than twelve transistors, wherein the section includes five signal nodes and at least one output signal node;
configuring the section to output Q at the output signal node according to the combination of digital input values at the corresponding input signal nodes; and
wherein Q is represented by the following truth table:

| S1 | X | Y | Q |
|---|---|---|---|
| 0 | 0 | — | 1 |
| 0 | 1 | — | $\overline{I_1}$ |
| 1 | 0 | — | 1 |
| 1 | 1 | — | $\overline{I_2}$. |

14. A circuit comprising:
a serial cascade TGM multiplexer having N input nodes, a multiplexer output node, and N-1 select nodes, where the multiplexer is configured to output a selected input signal to the multiplexer output node, depending on signals at the select nodes, without feedback or fan-out of the selected input signal;
a first P-channel transistor having a drain, a source connected to VDD, and a gate connected to a first control node;
a second P-channel transistor having a drain, a source connected to the drain of the first P-channel transistor, and a gate connected to a second control node;
a third P-channel transistor having a source, a drain, and a gate connected to the multiplexer output node;
a first N-channel transistor having a drain, a source connected to Ground, and a gate connected to the first control node;
a second N-channel transistor having a drain, a source connected to the drain of the first N-channel transistor, and a gate connected to the second control node;
third N-channel transistor having a source, a drain, and a gate connected to the multiplexer output node; and
circuit output node connected to the drains of the third P-channel and third N-channel transistors, and not coupled to any of the N input nodes of the serial cascade TGM multiplexer to avoid feedback.

15. The circuit of claim 14, wherein the drain of the first N-channel transistor is connected to the drain of the first P-channel transistor, and the source of the third N-channel transistor is connected to Ground.

16. The circuit of claim 14, wherein the drain of the first P-channel transistor is connected to the circuit output node, the source of the third P-channel transistor is connected to VDD, and the source of the third N-channel transistor is connected to the drain of the first N-channel transistor.

17. A circuit comprising:
a multiplexer having a plurality of TGM stages configured in a serial cascade arrangement, wherein each TGM stage is adapted to receive two input signals selectable by a separate select signal and to output a selected one of the two input signals, and wherein each TGM stage is configured without internal feedback or fan-out of the signal output from that TGM stage;
a circuit output node configured to output a final output signal;
a first P-channel transistor having a drain, a source connected to VDD, and a gate connected to a control node;
another P-channel transistor having a source connected to the drain of the first P-channel transistor, a drain connected to the circuit output node, and a gate connected to the multiplexer output node;

a first N-channel transistor having a drain connected to the circuit output node, a source connected to Ground, and a gate connected to the control node; and another N-channel transistor having a source connected Ground, a drain connected to the circuit output node, and a gate connected to the multiplexer output node;

where the circuit output node is not coupled to input the final output signal to the TGM stages of the multiplexer to avoid feedback.

18. The circuit of claim 17 constructed on a single integrated circuit.

19. A circuit comprising:

a multiplexer having a plurality of TGM stages configured in a serial cascade arrangement, wherein each TGM stage is adapted to receive two input signals selectable by a separate select signal and to output a selected one of the input signals, and wherein each TGM stage is configured without internal feedback or fan-out of the signal output from that TGM stage;

circuit output node configured to output a final output signal;

a first P-channel transistor having a source connected to VDD, a drain connected to a circuit output node, and a gate connected to a control node;

another P-channel transistor having a source connected to VDD, a drain connected to the circuit output node, and a gate connected to the multiplexer output node;

a first N-channel transistor having a drain, a source connected to Ground, and a gate connected to the control node; and another N-channel transistor having a source connected to the drain of the first N-channel transistor, a drain connected to the circuit output node, and a gate connected to the multiplexer output node;

wherein the circuit output node is not coupled to input the final output signal to the TGM stages of the multiplexer to avoid feedback.

20. The circuit of claim 19 constructed on a single integrated circuit.

* * * * *